(12) United States Patent
Chen et al.

(10) Patent No.: US 12,411,508 B2
(45) Date of Patent: Sep. 9, 2025

(54) SEMICONDUCTOR DEVICES INCLUDING VOLTAGE MONITORS

(71) Applicant: TAIWAN SEMICONDUCTOR MANUFACTURING COMPANY LTD., Hsinchu (TW)

(72) Inventors: Chih-Lin Chen, Hsinchu (TW); Chung-Sheng Yuan, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 431 days.

(21) Appl. No.: 18/154,848

(22) Filed: Jan. 15, 2023

(65) Prior Publication Data

US 2024/0176373 A1 May 30, 2024

Related U.S. Application Data

(60) Provisional application No. 63/384,954, filed on Nov. 24, 2022.

(51) Int. Cl.
  *G05F 1/56* (2006.01)
  *G06F 1/26* (2006.01)
  *H03K 19/173* (2006.01)
  *H03K 19/20* (2006.01)

(52) U.S. Cl.
  CPC ............... *G05F 1/56* (2013.01); *G06F 1/26* (2013.01); *H03K 19/1737* (2013.01); *H03K 19/20* (2013.01)

(58) Field of Classification Search
  CPC ......... G05F 1/56; G06F 1/26; H03K 19/1737; H03K 19/20
  See application file for complete search history.

(56) References Cited

U.S. PATENT DOCUMENTS

| 2008/0002797 A1* | 1/2008 | Raman | G01S 19/24 |
| | | | 375/355 |
| 2015/0058702 A1* | 2/2015 | Ramamoorthy | G11C 16/10 |
| | | | 714/773 |

OTHER PUBLICATIONS

S. Dietel et al., "A compact on-chip IR-drop measurement system in 28 nm CMOS technology," 2014 IEEE International Symposium on Circuits and Systems (ISCAS), 2014, pp. 1219-1222, doi: 10.1109/ISCAS.2014.6865361.

(Continued)

*Primary Examiner* — Adolf D Berhane
*Assistant Examiner* — Afework S Demisse
(74) *Attorney, Agent, or Firm* — WPAT LAW; Anthony King

(57) ABSTRACT

The present disclosure provides a voltage monitor and a semiconductor device including the voltage monitor. The voltage monitor includes a first voltage-to-digital converter (VDC), a second VDC, a first digital-to-binary converter (DBC), a second DBC, and an adder. The first VDC is configured to generate a first digital signal in response to a clock signal, and the second VDC is configured to generate a second digital signal in response to the clock signal. The first DBC is connected to the first VDC, and configured to convert the first digital signal to a first binary signal. The second DBC is connected to the second VDC, and configured to convert the second digital signal to a second binary signal. The adder is connected to the first DBC and the second DBC, and configured to combine the first binary signal and the second binary signal into an output signal.

20 Claims, 17 Drawing Sheets

(56) References Cited

OTHER PUBLICATIONS

S. Nishizawa and H. Onodera, "Ring oscillator with calibration circuit for accurate on-chip IR-drop measurement," 2012 IEEE International Conference on Microelectronic Test Structures, 2012, pp. 3-8, doi: 10.1109/ICMTS.2012.6190602.
H. Y. T. To et al., "A Novel Programmable On-chip Voltage Droop Detector for FPGA Applications," 2016 IEEE 66th Electronic Components and Technology Conference (ECTC), 2016, pp. 2009-2015, doi: 10.1109/ECTC.2016.399.

* cited by examiner

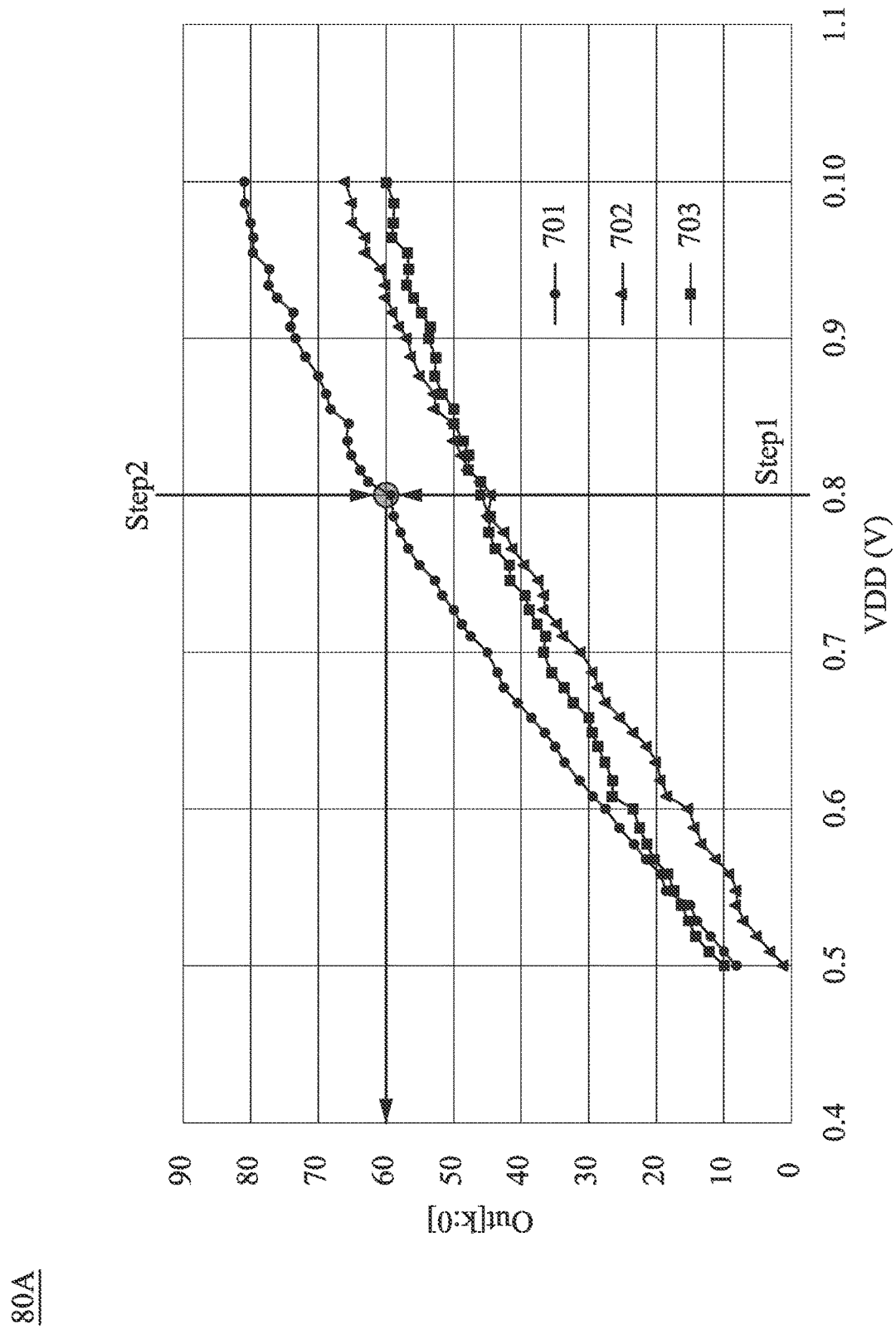

SEMICONDUCTOR DEVICES INCLUDING VOLTAGE MONITORS

PRIORITY CLAIM AND CROSS-REFERENCE

This application claims the benefit of prior-filed provisional application No. 63/384,954, filed on Nov. 24, 2022.

BACKGROUND

The present disclosure relates to a semiconductor device including one or more voltage monitors to monitor power voltage (VDD).

In semiconductor industries, VDD droop may result from chip activity, and can lead to timing violations and inhibit speed/performance. Generally, designs can define a high voltage margin to minimize the effect of VDD droop on chip performance. However, the high voltage margin increases power consumption. Therefore, an improved accurate voltage monitor for monitoring VDD droop is required.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features can be arbitrarily increased or reduced for clarity of discussion.

FIG. 8A shows an exemplary method for calibrating the voltage monitor of the semiconductor device, in accordance with some embodiments of the present disclosure.

DETAILED DESCRIPTION

Figure 1A:
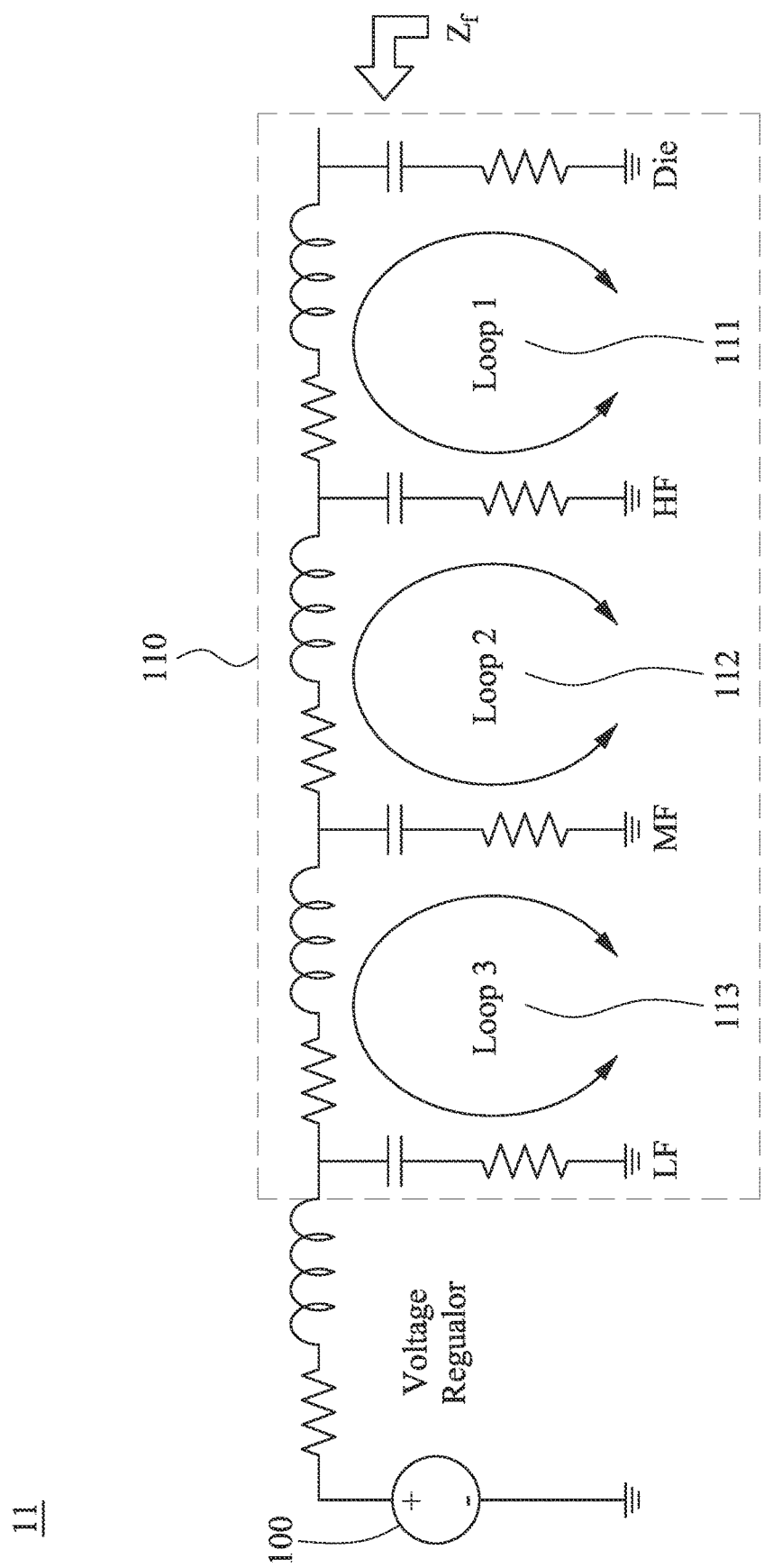
FIG. 1A shows an equivalent circuit of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it can be directly connected to or coupled to the other element, or intervening elements can be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device can be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

FIG. 1A shows an equivalent circuit 11 of a semiconductor device, in accordance with some embodiments of the present disclosure. The circuit 11 includes a voltage regulator 100 and a semiconductor device 110. The semiconductor device 110 includes a first loop 111, a second loop 112, and a third loop 113.

In some embodiments, the semiconductor device 110 may include a substrate (such as printed circuit board (PCB)), and one or more semiconductor packages including one or more dies disposed on the substrate. The semiconductor device 110 can receive the power supply voltage (VDD) from the voltage regulator 100. In some embodiments, the activity of the semiconductor device 110 causes power supply voltage (VDD) droop (also known as IR drop). The VDD droop can include three kinds of VDD droop, which will be discussed in accordance with FIG. 1B.

Figure 1B:
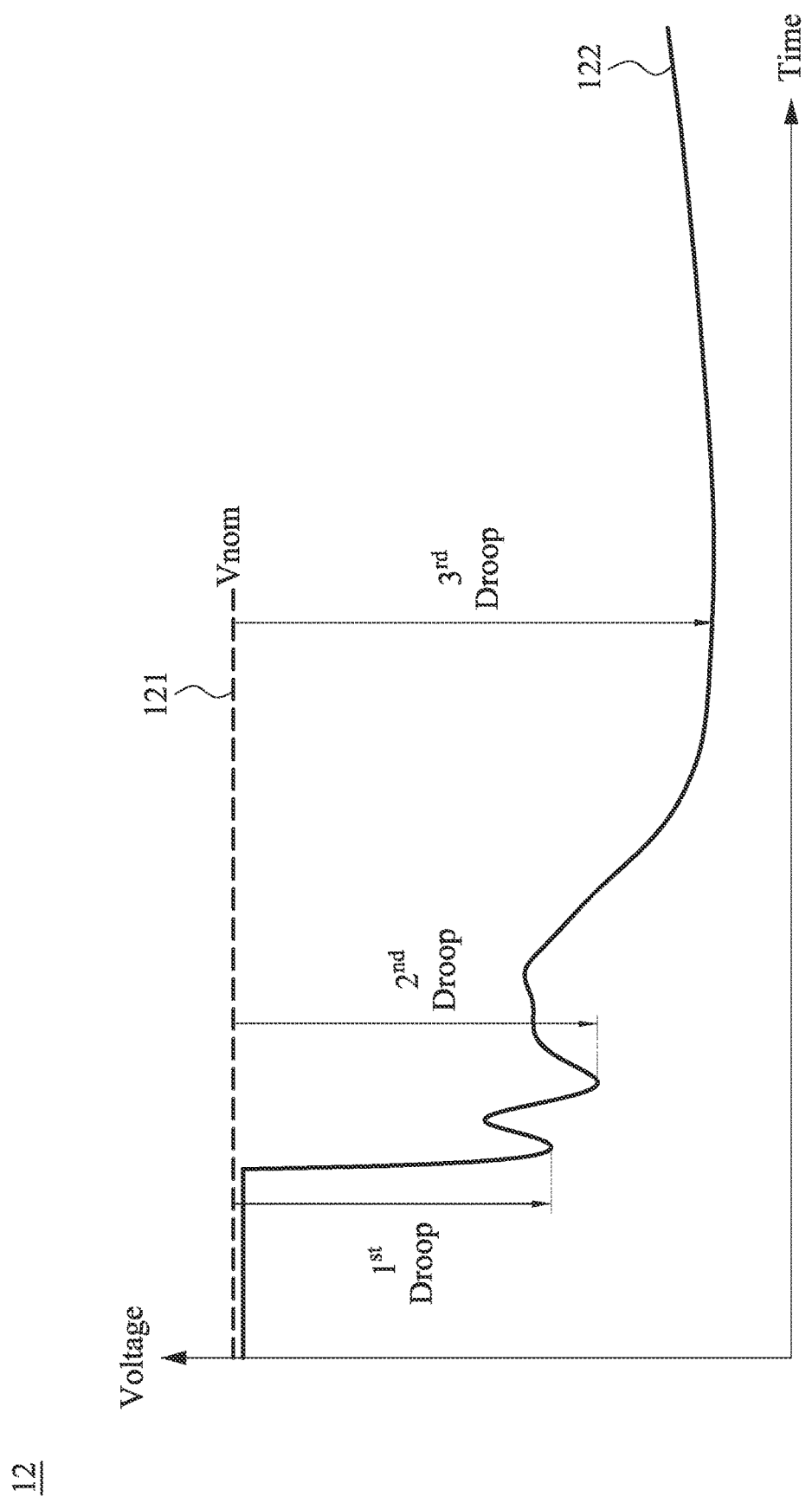
FIG. 1B is a graph illustrating time versus power voltage of a semiconductor device, in accordance with some embodiments of the present disclosure.

FIG. 1B is a graph 12 illustrating time versus power voltage of a semiconductor device, in accordance with some embodiments of the present disclosure. Referring to FIG. 1B, the x-axis represents time and y-axis represents voltage. The graph 12 shows line 121 and curve 122. Line 121 shows the power supply voltage (also called the nominal voltage $V_{nom}$) supplied to the semiconductor device 100. In some embodiments, the nominal voltage $V_{nom}$ can be a constant voltage. Therefore, the line 121 can be a horizontal line. The curve 122 shows the VDD of the semiconductor device 100 varying with time passage. The curve 122 can approach the line 121 at the beginning. In some embodiments, the curve 122 includes three droops (marked $1^{st}$ Droop, $2^{nd}$ Droop, and $3^{rd}$ Droop).

The first droop of the curve 122 may be determined by the resistance, capacitance, and inductance of the die and semiconductor package of the semiconductor device. In some embodiments, the first droop occurs due to the elements in the semiconductor device activated from a low current mode to a high current mode (for example, the semiconductor device is activated from idle). The second droop of the curve 122 may be determined by the resistance, capacitance, and inductance of the semiconductor package and substrate (PCB) of the semiconductor device. In some embodiments, the second droop occurs due to the elements in the semiconductor device activated from a low current mode to a high current mode (for example, the semiconductor device is activated from idle). The second droop can result from the same reason of the first droop, but happen later than the first droop. The third droop of the curve 122 may be determined by the resistance, capacitance, and inductance of the semiconductor package and substrate (PCB) of the semiconductor device. In some embodiments, the third droop occurs due to the elements in the semiconductor device activated from a low current mode to a high current mode (for example, the semiconductor device is activated from idle). The third droop can result from the same reason of the second droop, but happen later than the second droop.

Figure 2A:
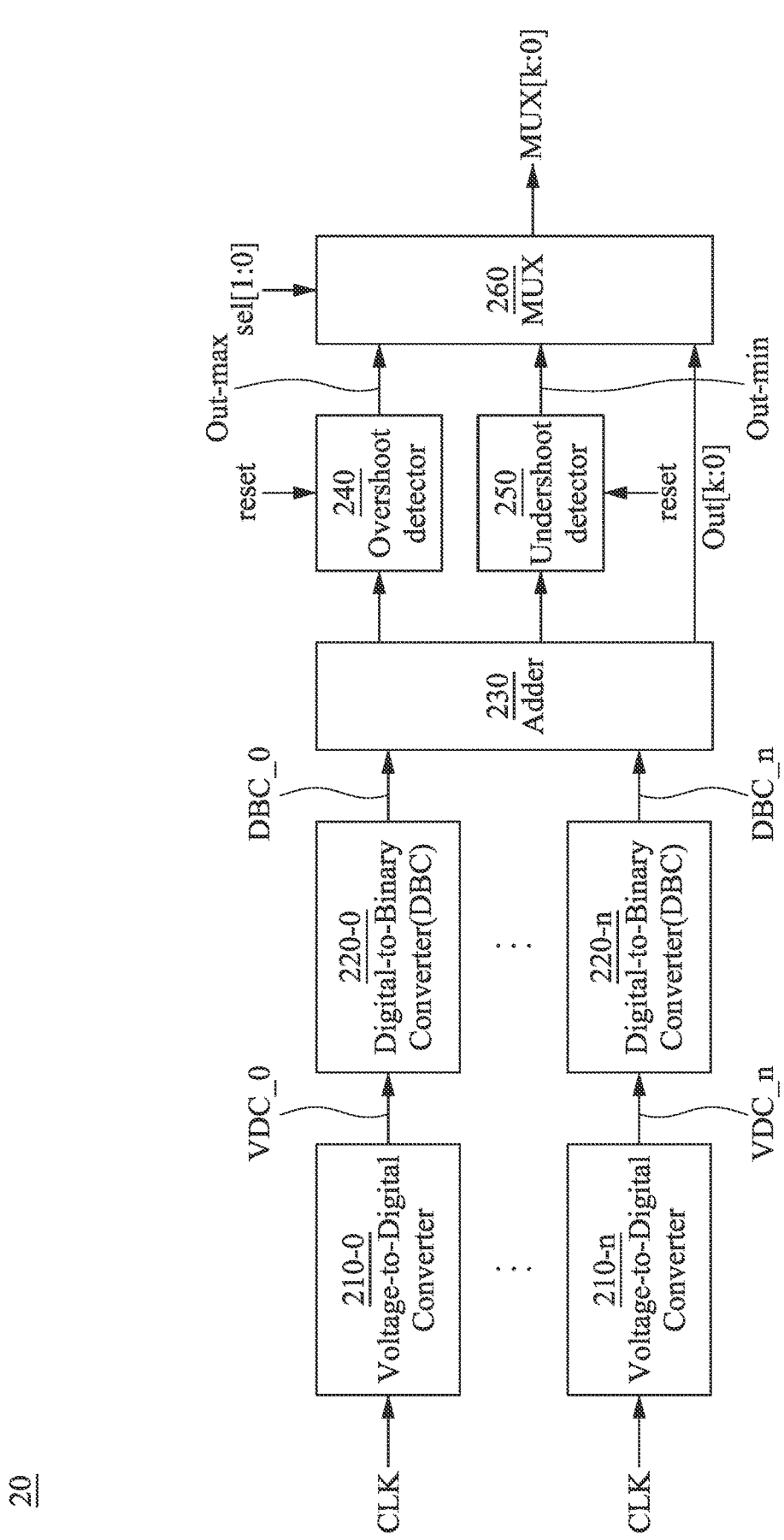
FIG. 2A shows an architecture of a voltage monitor for monitoring the power voltage of a semiconductor device, in accordance with some embodiments of the present disclosure.

Referring back to FIG. 1A, the voltage regulator 100 provides VDD to the semiconductor device 110. The first loop 111 includes resistance, capacitance, and inductance of dies and semiconductor packages activated from a low current mode to a high current mode (for example, the semiconductor device is activated from idle). In some embodiments, the first loop 111 can correspond to $1^{st}$ Droop in FIG. 1B. That is, $1^{st}$ Droop occurs due to the first loop 111. The second loop 112 includes resistance, capacitance, and inductance of semiconductor packages and substrates activated from a low current mode to a high current mode (for example, the semiconductor device is activated from idle). In some embodiments, the second loop 112 can correspond to the $2^{nd}$ Droop in FIG. 1B. That is, the $2^{nd}$ Droop occurs due to the second loop 112. The third loop 113 includes resistance, capacitance, and inductance of semiconductor packages and substrates activated from a low current mode to a high current mode (for example, the semiconductor device is activated from idle). In some embodiments, the third loop 113 can correspond to the $3^{rd}$ Droop in FIG. 1B. That is, the $3^{rd}$ Droop occurs due to the third loop 113. FIG. 2A shows an architecture of a voltage monitor 20 for monitoring the power voltage of a semiconductor device, in accordance with some embodiments of the present disclosure. The voltage monitor 20 includes voltage-to-digital converters (VDC) 210-0, 210-1, 210-2 . . . and 210-$n$, digital-to-binary converters (DBC) 220-0, 220-1, 220-2 . . . and 220-$n$, an adder 230, an overshoot detector 240, an undershoot detector 250, and a multiplexer (MUX) 260.

Referring to FIG. 2A, the voltage monitor 20 can include two or more VDCs 210-0, 210-1, 210-2 . . . and 210-$n$. For example, the voltage monitor 20 can include two, four, eight, or sixteen VDCs. The VDCs 210-0 and 210-$n$ can be configured to receive the clock signal CLK. In some embodiments, the VDCs 210-0 and 210-$n$ can be configured to generate a digital signal in response to a clock signal CLK. The VDC 210-0 is configured to generate a digital signal VDC_0 in response to the clock signal CLK. The VDC 210-$n$ is configured to generate a digital signal VDC_n in response to the clock signal CLK.

In some embodiments, each VDC may include one or more delay cells to generate the digital signal in response to the clock signal CLK. The digital signals VDC_0 and VDC_n can be a 1-bit, 2-bit, 3-bit, 4-bit . . . or 16-bit signal. In some embodiments, the digital signal can be more than 16 bits. In some embodiments, the bit count of the digital signal can depend on the number of the delay cells (shown in FIG. 2B) included in the VBCs 210-0 and 210-$n$. In some embodiments, the form of the digital signal is not limited. For example, the digital signal can be in the form of thermometer code or one hot encoding.

The voltage monitor 20 can include two or more DBCs 220-0, 220-1, 220-2 . . . and 220-$n$. For example, the voltage monitor 20 can include two, four, eight, or sixteen DBCs. In some embodiments, the number of the DBCs can be identical to that of the VBCs. The DBCs 220-0 and 220-$n$ are connected to a corresponding VBC. For example, the DBC 220-0 can be connected to the VBC 210-0, and the DBC 220-$n$ can be connected to the VBC 210-$n$.

In some embodiments, the DBC 220-0 can be configured to receive the digital signal VDC_0, and the DBC 220-$n$ can be configured to receive the digital signal VDC_n. In some embodiments, the DBC can convert the digital signal generated by the corresponding VDC to a binary signal. The DBC 220-0 can be configured to convert the digital signal VDC_0 to a binary signal DBC_0. The DBC 220-$n$ can be configured to convert the digital signal VDC_n to a binary signal DBC_n. In some embodiments, the binary signals DBC_0 and DBC_n can be 1-bit, 2-bit, 3-bit, 4-bit . . . or 16-bit signal. In some embodiments, the binary signal can be more than 16 bits. In some embodiments, the bit count of the binary signal can be less than the bit count of the corresponding digital signal. For example, the DBC 220-0 can convert a 15-bit digital signal VDC_0 to a 4-bit binary signal DBC_0.

In some embodiments, when the digital signal VDC_0 is 15-bit, being presented as VDC[14:0]=15'b000000000000000, the DBC 220-0 can convert it to a 4-bit binary signal DBC[3:0]=4'b0000. In some embodiments, the DBC 220-0 can convert the 15-bit digital signal VDC_0, being presented as VDC[14:0]=15'b000000000000011, to a 4-bit binary signal DBC[3:0]=4'b0010.

The binary signals DBC_0 and DBC_n can be transmitted to the adder 230. In some embodiments, the adder 230 can be connected to the DBCs 220-0 and 220-n. The adder 230 can be configured to receive two or more binary signals DBC_0, DBC_1, DBC_2 ... and DBC_n. The adder 230 can be configured to generate an output signal Out[k:0] based on the binary signals DBC_0, DBC_1, DBC_2 ... and DBC_n. The adder 230 can be configured to combine the binary signals DBC_0, DBC_1, DBC_2 ... and DBC_n into an output signal Out[k:0]. In some embodiments, the bit count of the output signal Out[k:0] can exceed the bit count of the binary signals DBC_0 and DBC_n. For example, if the 4-bit binary signals DBC_0 and DBC_n are received by the adder 230, the adder 230 can be configured to combine them into a 7-bit output signal Out[k:0]. As the signals are converted to the binary form, it is suitable for the adder 230 to combine them.

The output signal Out[k:0] can be monitored and recorded. In some embodiments, the output signal Out[k:0] can be transmitted to the overshoot detector 240. The overshoot detector 240 can be connected to the adder 230. In some embodiments, the overshoot detector 240 can be configured to receive the output signal Out[k:0]. The overshoot detector 240 can be configured to detect a maximum value Out-max of the output signal Out[k:0]. The overshoot detector 240 can store the maximum value Out-max of the output signal Out[k:0]. In some embodiments, the maximum value Out-max of the output signal Out[k:0] can be transmitted to the MUX 260. In some embodiments, the overshoot detector 240 can be configured to receive a reset signal.

In some embodiments, the output signal Out[k:0] can be transmitted to the undershoot detector 250. The undershoot detector 250 can be connected to the adder 230. In some embodiments, the undershoot detector 250 can be configured to receive the output signal Out[k:0]. The undershoot detector 250 can be configured to detect a minimum value Out-min of the output signal Out[k:0]. The overshoot detector 240 can store the minimum value Out-min of the output signal Out[k:0]. In some embodiments, the minimum value Out-min of the output signal Out[k:0] can be transmitted to the MUX 260. In some embodiments, the undershoot detector 250 can be configured to receive a reset signal.

Figure 3A:
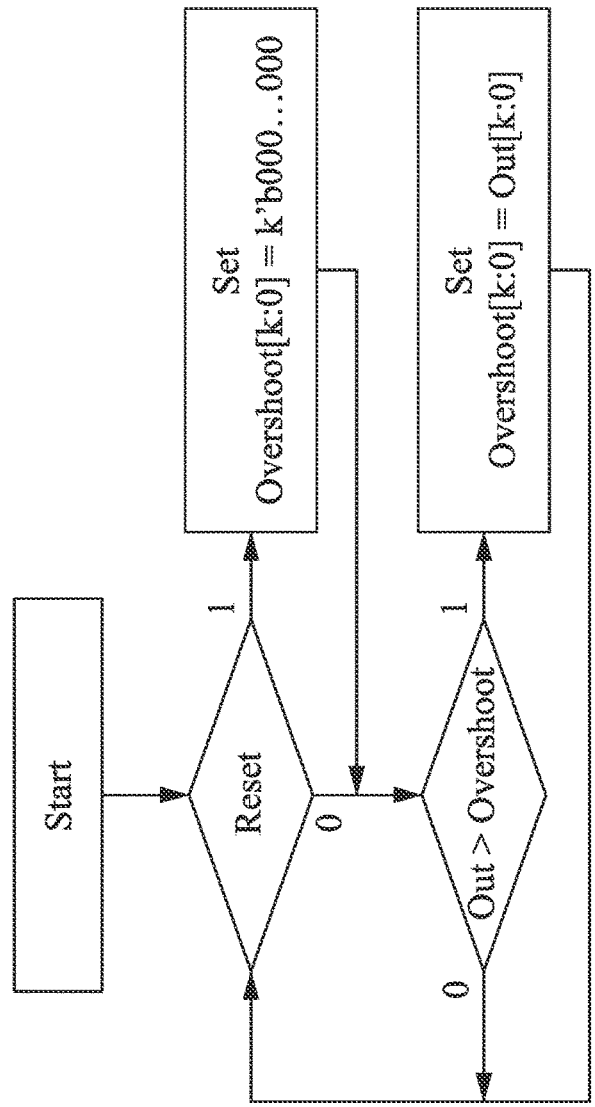
FIG. 3A is a flowchart showing operations of a voltage monitor, in accordance with some embodiments of the present disclosure.

FIG. 3A is a flowchart 30A showing operation of a voltage monitor, in accordance with some embodiments of the present disclosure. The operations of the overshoot detector 240 of the voltage monitor 20 are shown in FIG. 3A.

Referring to FIG. 3A, the overshoot detector 240 can be reset in response to the reset signal at the beginning. Before detecting the output signal Out[k:0] from the adder 230, the overshoot detector 240 can be set as an initial signal having the least value, in response to the reset signal. For example, the overshoot detector 240 can store an initial signal Overshoot[k:0]=k'b000 ... 000. The overshoot detector 240 can compare the output signal Out[k:0] and the current value stored in the overshoot detector 240. When the value of the output signal Out[k:0] is greater than the stored value, the output signal Out[k:0] is stored in the overshoot detector 240. On the other hand, if the value of the output signal Out[k:0] is less than the stored value, the output signal Out[k:0] is not stored in the overshoot detector 240. After the comparison, the overshoot detector 240 returns to check if the reset signal is received, and continue operations for detecting the next output signal Out[k:0].

The operation of FIG. 3A can be performed repeatedly by the overshoot detector 240, such that the overshoot detector 240 can store a maximum value of the output signal Out[k:0].

Figure 3B:
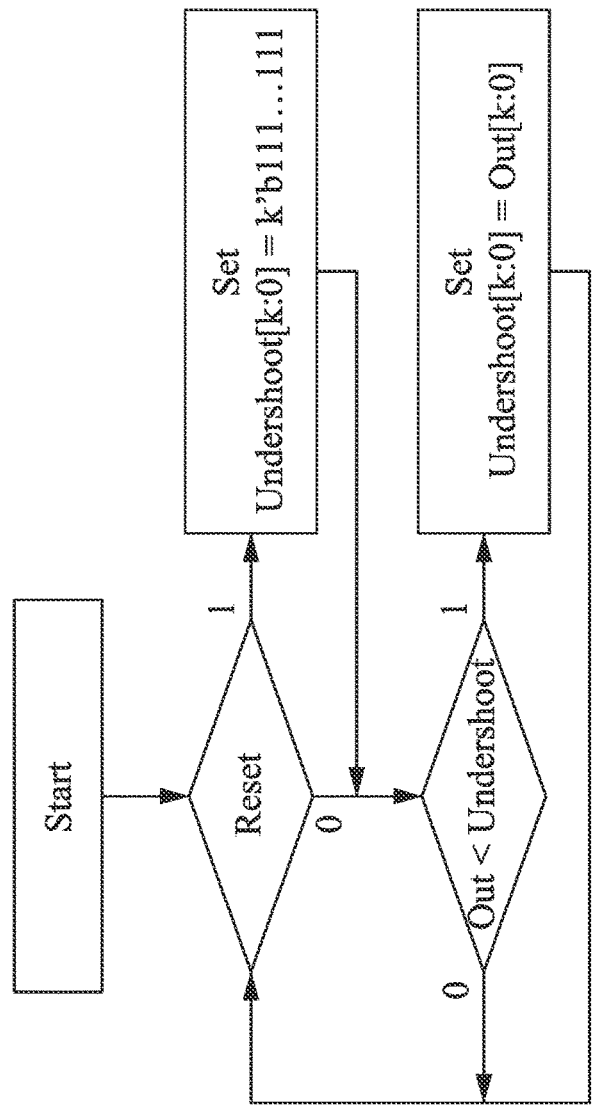
FIG. 3B is a flowchart showing operations of a voltage monitor, in accordance with some embodiments of the present disclosure.

FIG. 3B is a flowchart 30B including operation of a voltage monitor, in accordance with some embodiments of the present disclosure. The operations of the undershoot detector 250 of the voltage monitor 20 are shown in FIG. 3B. Referring to FIG. 3B, the undershoot detector 250 can be reset in response to the reset signal at the beginning. Before detecting the output signal Out[k:0] from the adder 230, the undershoot detector 250 can be set as an initial signal having the greatest value, in response to the reset signal. For example, the undershoot detector 250 can store an initial signal Undershoot[k:0]-k'b111 ... 111. The undershoot detector 250 can compare the output signal Out[k:0] and the current value stored in the undershoot detector 250. When the value of the output signal Out[k:0] is less than the stored value, the output signal Out[k:0] is stored in the undershoot detector 250. On the other hand, if the value of the output signal Out[k:0] is greater than the stored value, the output signal Out[k:0] is not stored in the undershoot detector 250, and the undershoot detector 250 will be ready to receive the next output signal Out[k:0]. After the comparison, the undershoot detector 250 will go back to check if the reset signal is received, and continue operations for detecting the next output signal Out[k:0].

The operation of FIG. 3B can be performed repeatedly by the undershoot detector 250, such that the undershoot detector 250 can store a minimum value of the output signal Out[k:0].

In some embodiments, the overshoot detector 240 and the undershoot detector 250 can be arranged in parallel as shown in FIG. 2A. That is, the overshoot detector 240 and the undershoot detector 250 can receive the output signal Out[k:0] in parallel, and then process the comparison.

The MUX 260 can be connected to the adder 230. In some embodiments, the MUX 260 can be configured to receive the current value of the output signal Out[k:0] from the adder 230. The MUX 260 can be connected to the overshoot detector 240. In some embodiments, the MUX 260 can be configured to receive the maximum value Out-max of the output signal Out[k:0] from the overshoot detector 240. The MUX 260 can be connected to the undershoot detector 250. In some embodiments, the MUX 260 can be configured to receive the minimum value Out-max of the output signal Out[k:0] from the undershoot detector 250.

The MUX 260 can be configured to receive three different values of the output signal Out[k:0]. The MUX 260 can be configured to receive a select signal sel[1:0]. In response to the select signal sel[1:0], the MUX 260 can output a MUX output signal MUX[k:0], which is selected from the current value, the maximum value Out-max, and the minimum value Out-max of the output signal Out[k:0].

In some embodiments, the correspondence between the select signal sel[1:0] received by the MUX 260 and the MUX output signal MUX[k:0] is shown in Table 1 as follows.

TABLE 1

| sel[1:0] | MUX[k:0] |
|---|---|
| 00 | Out[k:0] |
| 01 | Overshoot[k:0] |
| 10 | Undershoot[k:0] |

Figure 2B:
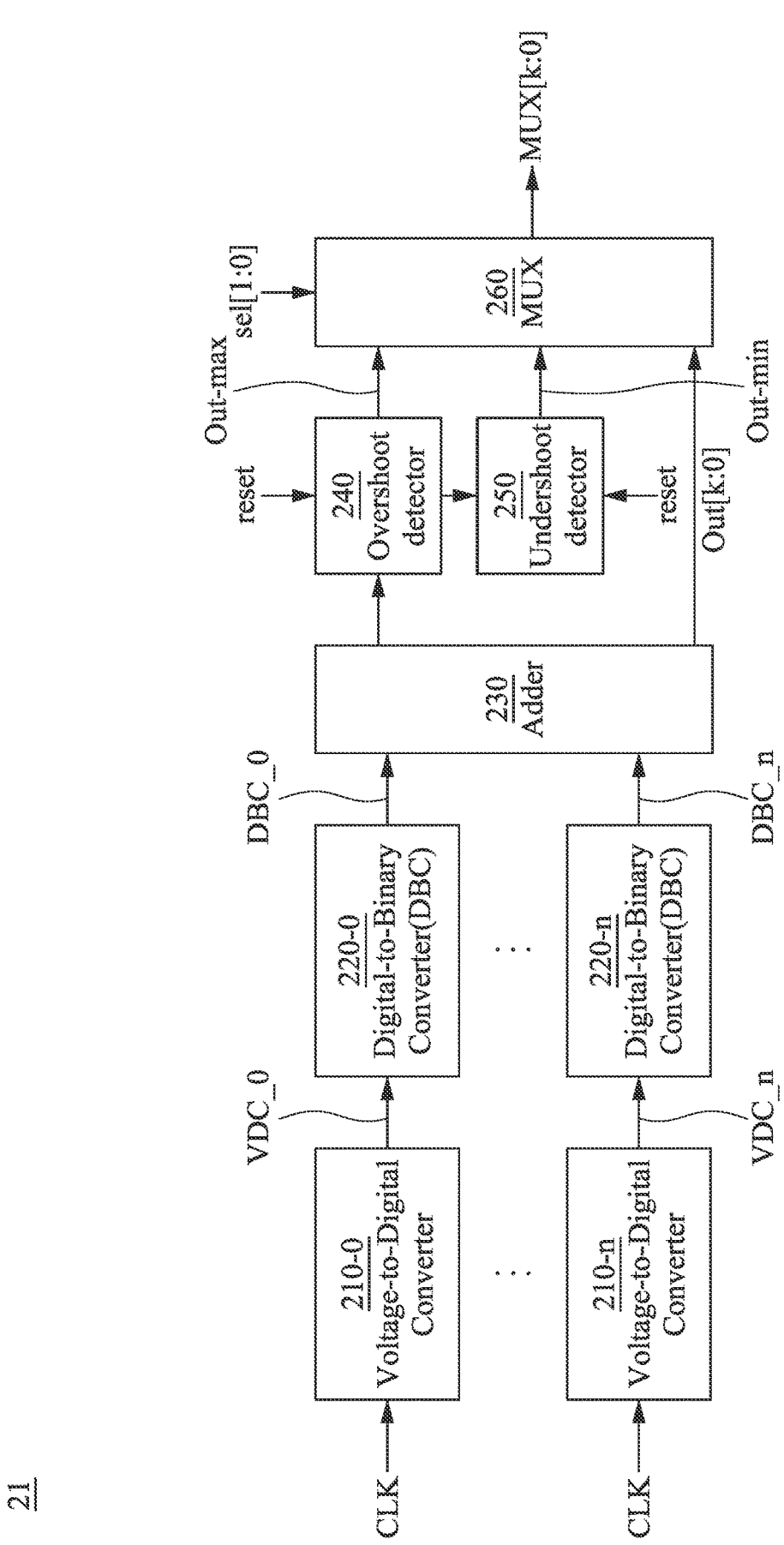
FIG. 2B shows an architecture of a voltage monitor for monitoring the power voltage of a semiconductor device, in accordance with some embodiments of the present disclosure.

FIG. 2B shows an architecture of a voltage monitor 21 for monitoring the power voltage of a semiconductor device, in accordance with some embodiments of the present disclosure. The voltage monitor 21 is similar to the voltage monitor 20 in FIG. 2A, with the difference therebetween being arrangement of the overshoot detector 240 and the undershoot detector 250. Referring to FIG. 2B, the undershoot detector 250 is connected to the overshoot detector 240 to receive the output signal Out[k:0] from the adder 230 through the overshoot detector 240. In some embodiments, the overshoot detector 240 and the undershoot detector 250 can be arranged in sequence as shown in FIG. 2B. That is, the overshoot detector 240 and the undershoot detector 250 can receive the output signal Out[k:0] in sequence, and then process the comparison.

Figure 3C:
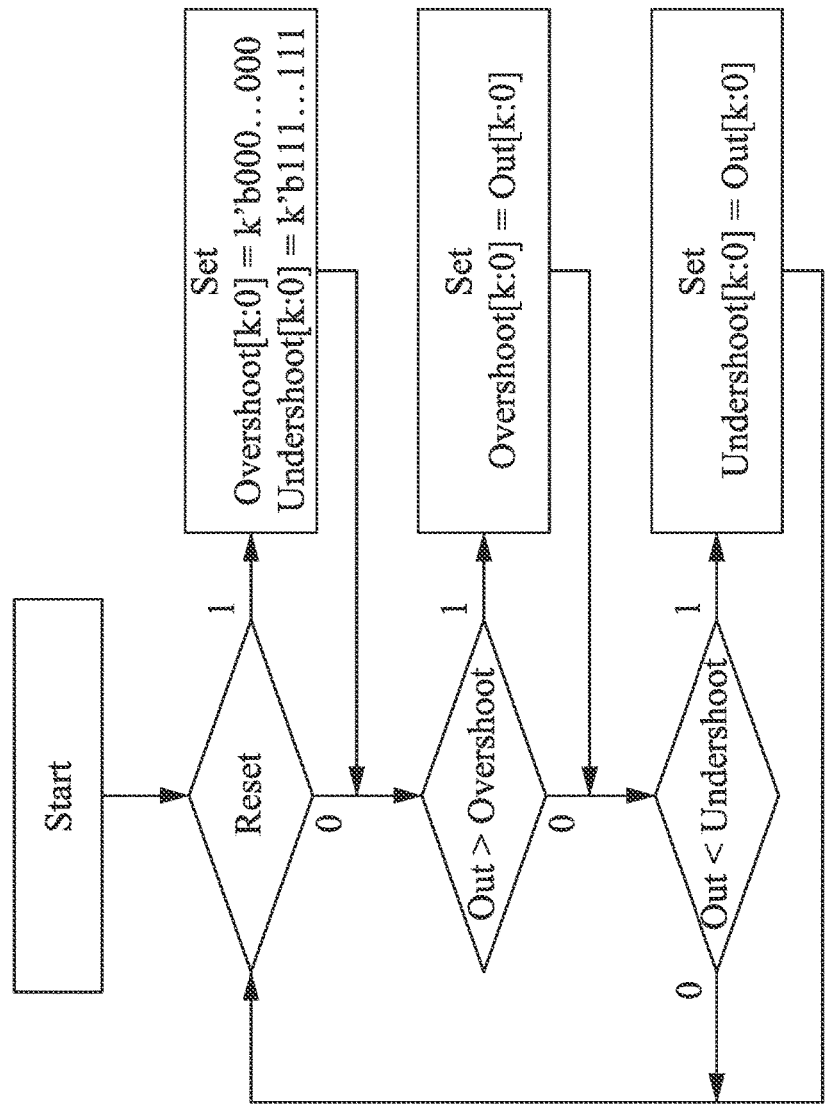
FIG. 3C is a flowchart showing operations of a voltage monitor, in accordance with some embodiments of the present disclosure.

FIG. 3C is a flowchart 30C showing operation of a voltage monitor, in accordance with some embodiments of the present disclosure. The operations of the overshoot detector 240 and the undershoot detector 250 of the voltage monitor 21 are shown in FIG. 3C.

Referring to FIG. 3C, the overshoot detector 240 and the undershoot detector 250 can be reset in response to the reset signal at the beginning. Before detecting the output signal Out[k:0], the overshoot detector 240 can be set as an initial signal having the least value, in response to the reset signal. For example, the overshoot detector 240 can store an initial signal Overshoot[k:0]=k'b000 . . . 000. The overshoot detector 240 can compare the output signal Out[k:0] and the current value stored in the overshoot detector 240. The undershoot detector 250 can be set as an initial signal having the greatest value, in response to the reset signal. For example, the undershoot detector 250 can store an initial signal Undershoot[k:0]=k'b111 . . . 111.

The overshoot detector 240 can receive the output signal Out[k:0] from the adder 230. The overshoot detector 240 can compare the output signal Out[k:0] and the current value of the signal Overshoot[k:0] stored in the overshoot detector 240. When the value of the output signal Out[k:0] is greater than the stored value, the output signal Out[k:0] is stored in the overshoot detector 240. On the other hand, if the value of the output signal Out[k:0] is less than the stored value, the output signal Out[k:0] is not stored in the overshoot detector 240. After the comparison, the overshoot detector 240 will transmit the output signal Out[k:0] to the undershoot detector 250.

The undershoot detector 250 can receive the output signal Out[k:0] from the overshoot detector 240. The undershoot detector 250 can compare the output signal Out[k:0] and the current value of the signal Undershoot[k:0] stored in the undershoot detector 250. When the value of the output signal Out[k:0] is less than the stored value, the output signal Out[k:0] is stored in the undershoot detector 250. On the other hand, if the value of the output signal Out[k:0] is greater than the stored value, the output signal Out[k:0] is not stored in the undershoot detector 250, and the undershoot detector 250 will be ready to receive the next output signal Out[k:0]. After the comparison, the undershoot detector 250 will go back to check if the reset signal is received, and continue operations for detecting the next output signal Out[k:0].

Figure 4A:
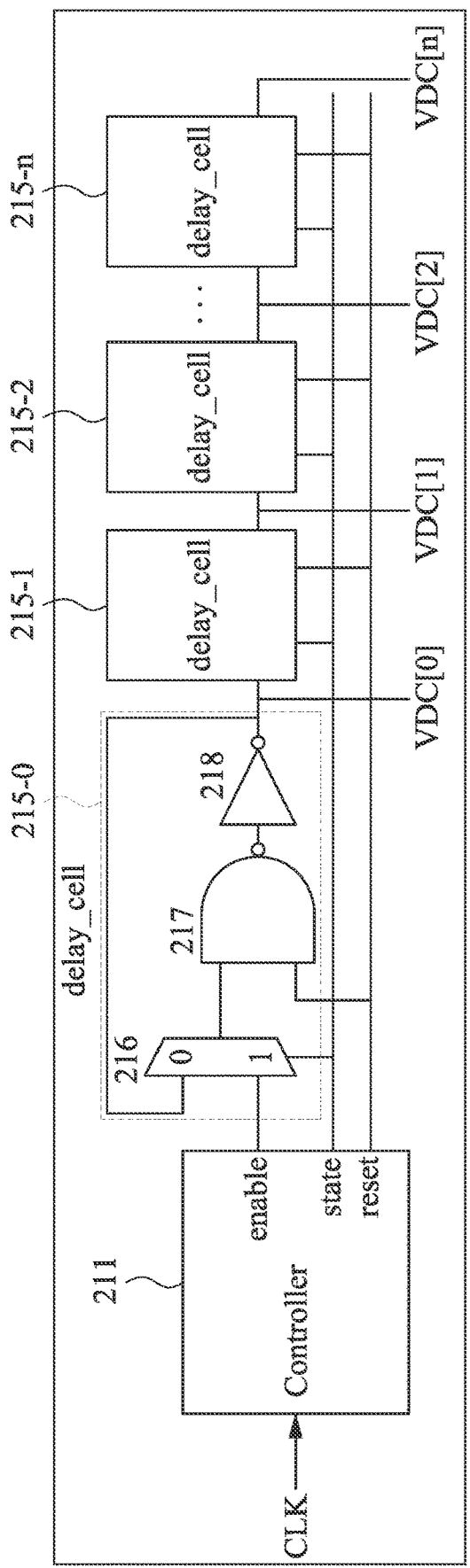
FIG. 4A shows an architecture of a voltage-to-digital converter included in a voltage monitor, in accordance with some embodiments of the present disclosure.

FIG. 4A shows an architecture of a voltage-to-digital converter 210 included in the voltage monitor, in accordance with some embodiments of the present disclosure. In some embodiments, the voltage-to-digital converter (VDC) 210 can be included in the voltage monitor 20 or 21. The VDC 210 in FIG. 4A can be any one of the VDCs 210-0 . . . and 210-n in FIGS. 2A and 2B.

The VDC 210 includes a controller 211 and one or more delay cells 215-0, 215-1, 215-2 . . . and 215-n. In some embodiments, the delay cell 215-1 can include a multiplexer (MUX) 216, a NAND gate 217, and an inverter 218. In some embodiments, the delay cells 215-1, 215-2 . . . and 215-n can have an arrangement similar to the delay cell 215-1.

Referring to FIG. 4A, the controller 211 is configured to receive the clock signal CLK. The controller 211 can be configured to generate an enable signal, a state signal, and a reset signal. In some embodiments, the controller 211 can be configured to generate the enable signal, the state signal, and the reset signal based on the clock signal CLK.

The delay cell 215-0 is connected to the controller 211. In some embodiments, the delay cell 215-0 can include a reset terminal configured to receive a reset signal, a first terminal configured to receive the enable signal, a second terminal configured to receive the state signal, and an output terminal configured to output an output signal VDC[0]. The delay cell 215-0 can be reset in response to the reset signal. In some embodiments, the delay cell 215-0 can generate the output signal VDC[0] in response to the enable signal and the state signal.

The delay cell 215-1 is connected to the controller and the delay cell 215-0. In some embodiments, the delay cell 215-1 can include a reset terminal configured to receive a reset signal, a first terminal configured to receive the output signal VDC[0] from the output terminal of the delay cell 215-0, a second terminal configured to receive the state signal, and an output terminal configured to output an output signal VDC[1]. The delay cell 215-1 can be reset in response to the reset signal. In some embodiments, the delay cell 215-1 can generate the output signal VDC[1] in response to the enable signal and the state signal. In some embodiments, the delay cell 215-1 can generate the output signal VDC[1] in response to the output signal VDC[0] and the state signal.

The delay cell 215-2 is connected to the controller and the delay cell 215-1. In some embodiments, the delay cell 215-2 can include a reset terminal configured to receive a reset signal, a first terminal configured to receive the output signal VDC[1] from the output terminal of the delay cell 215-1, a second terminal configured to receive the state signal, and an output terminal configured to output an output signal VDC[2]. The delay cell 215-2 can be reset in response to the reset signal. In some embodiments, the delay cell 215-2 can generate the output signal VDC[2] in response to the enable signal and the state signal. In some embodiments, the delay cell 215-2 can generate the output signal VDC[2] in response to the output signal VDC[1] and the state signal.

The delay cell 215-n is connected to the controller and the previous delay cell 215-n–1 (not shown in FIG. 4A). In some embodiments, the delay cell 215-n can include a reset terminal configured to receive a reset signal, a first terminal configured to receive the output signal VDC[n–1] (not shown in FIG. 4A) from the output terminal of the delay cell 215-n–1, a second terminal configured to receive the state signal, and an output terminal configured to output an output signal VDC[n]. The delay cell 215-n can be reset in response to the reset signal. In some embodiments, the delay cell 215-n can generate the output signal VDC[n] in response to the enable signal and the state signal. In some embodiments, the delay cell 215-n can generate the output signal VDC[n] in response to the output signal VDC[n–1] and the state signal.

The output signal VDC[0] of the delay cell 215-0, the output signal VDC[1] of the delay cell 215-1, the output signal VDC[2] of the delay cell 215-2, . . . and VDC[n] of the delay cell 215-n are combined to be the output signal of the VDC 210. Accordingly, the output signal of the VDC 210 can be an n-bit signal. The digital signal VDC_0 generated by the VDC 210-0 can be based on the output signal VDC[0] generated by the delay cell 215-0, the output signal VDC[1] generated by the delay cell 215-1, the output signal VDC[2] generated by the delay cell 215-2, . . . and the output signal VDC[n] generated by the delay cell 215-n. In some embodiments, the output signal of the VDC 210 can be VDC_0 . . . or VDC_n in FIG. 2A.

Referring to FIG. 4A, the delay cell 215-0 includes the MUX 216. The MUX 216 can be a two-to-one multiplexer. The MUX 216 can be connected to the controller 211. In some embodiments, the MUX 216 can include a first input terminal, a second input terminal, a selector terminal, and an output terminal. The MUX 216 can be configured to receive the enable signal from the controller 211 through the first input terminal. The MUX 216 can be configured to receive the state signal from the controller 211 through the selector terminal.

The NAND gate 217 of the delay cell 215-0 can be connected to the MUX 216 and the controller 211. In some embodiments, the NAND gate 217 can include a first input terminal connected to the output terminal of the MUX 216, a second input terminal, and an output terminal. The NAND gate 217 can be configured to receive the reset signal from the controller 211 through the second input terminal. In some embodiments, the NAND gate 217 can be any types of logic gates. For example, the logic gate can be NOR, OR, AND, etc.

The inverter 218 of the delay cell 215-0 can be connected to the NAND gate 217. The inverter 218 can be connected to the MUX 216. The inverter 218 can include an input terminal connected to the output terminal of the NAND gate 217 and an output terminal connected to the second input terminal of the MUX 216. The output terminal of the inverter 218 can be connected to the first terminal of the delay cell 215-2. In some embodiments, the output signal VDC[0] can be obtained at the output terminal of the inverter 218.

According to the operations of the MUX 216, the NAND gate 217 and the inverter 218 included in the delay cell 215-0, the delay cell 215-0 can pass through or save the data based on the enable signal, state signal, and reset signal.

Figure 4B:
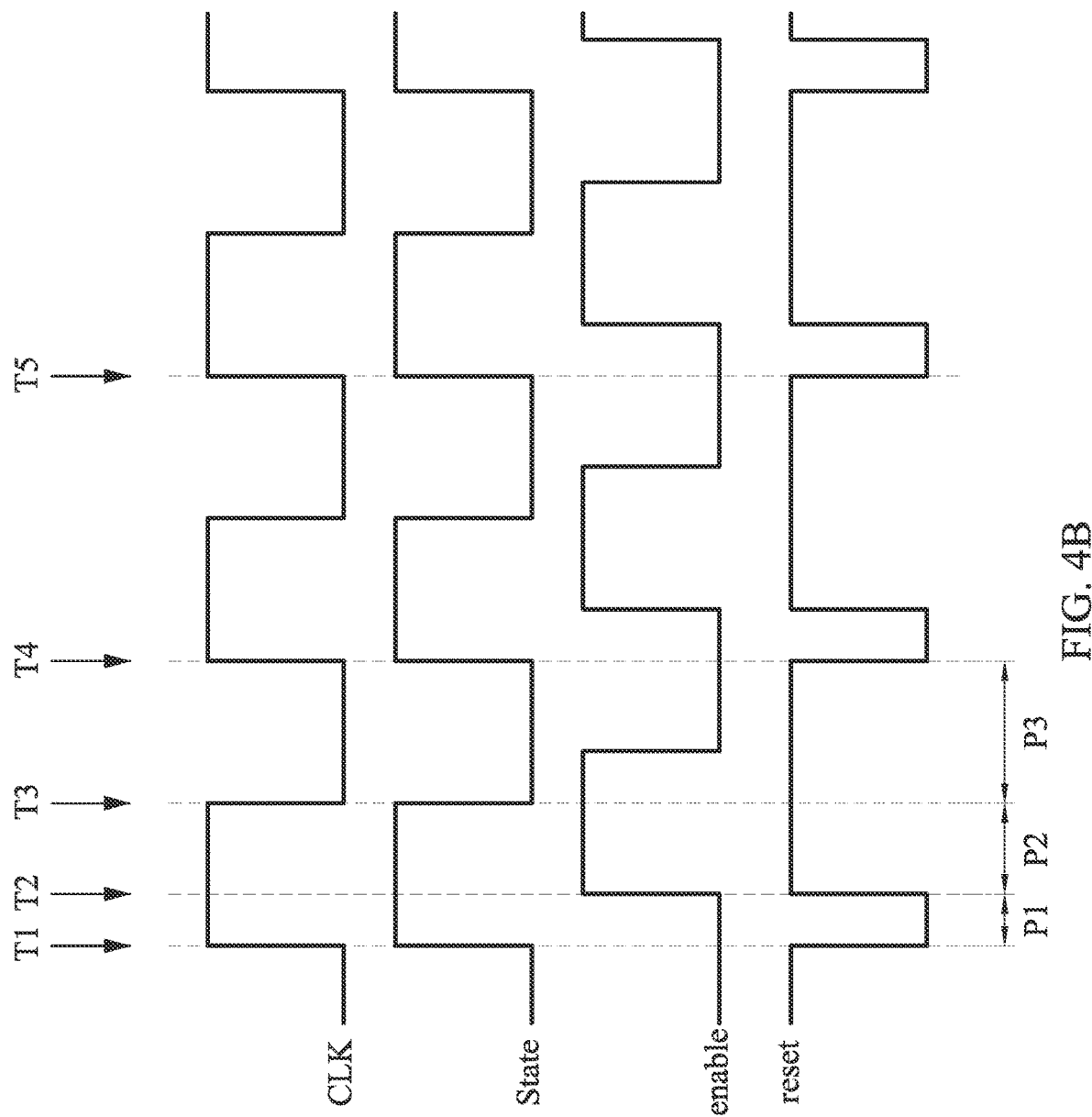
FIG. 4B is a timing diagram of the voltage-to-digital converter depicted in FIG. 4A, in accordance with some embodiments of the present disclosure.

FIG. 4B is a timing diagram of the voltage-to-digital converter 210 depicted in FIG. 4A, in accordance with some embodiments of the present disclosure. Referring to FIG. 4B, the clock signal CLK can be switched to logic high at the timing T1, and be switched to logic low at the timing T3. The clock signal CLK can then be switched to logic high after being logic low for a constant period, such as at the timing T4 and T5.

The controller 211 can be configured to generate the enable signal, the state signal, and the reset signal based on the clock signal CLK. The state signal can be substantially synchronized with the clock signal CLK. In some embodiments, the enable signal can be shifted a period (such as period P1) from the clock signal CLK. For example, the enable signal can be switched to logic high after the state signal switched to logic high for the period P1. In some embodiments, the enable signal can be switched to logic high at the timing T2. In some embodiments, the enable signal can have a frequency substantially identical to that of the clock signal CLK.

In some embodiments, the reset signal can have a frequency substantially identical to that of the clock signal CLK. The reset signal can be switched to logic low at the timing T1, and be switched to logic high at the timing T2 after being logic low for the period P1.

Referring back to FIG. 4A, the delay cell 215-0 of the VDC 210 can be configured to be reset during the period P1 in response to the reset signal. The delay cell 215-0 of the VDC 210 can be configured to be reset at the timing T1 in response to the reset signal. In some embodiments, the state signal and the reset signal can be switched at the timing T1. The delay cell 215-0 can be reset during the period P1 in response to the reset signal and the state signal. When all delay cells 215-0, 215-1, 215-2, . . . , and 215-n of the VDC 210 are reset, the output signal of the VDC 210 will be reset to 0.

In some embodiment, the delay cell 215-0 can be configured to be triggered during a second period P2 in response to the enable signal. The delay cell 215-0 can be configured to be triggered at the timing T2. In some embodiments, the enable signal and the reset signal are switched to logic high at the same time.

Figure 5A:
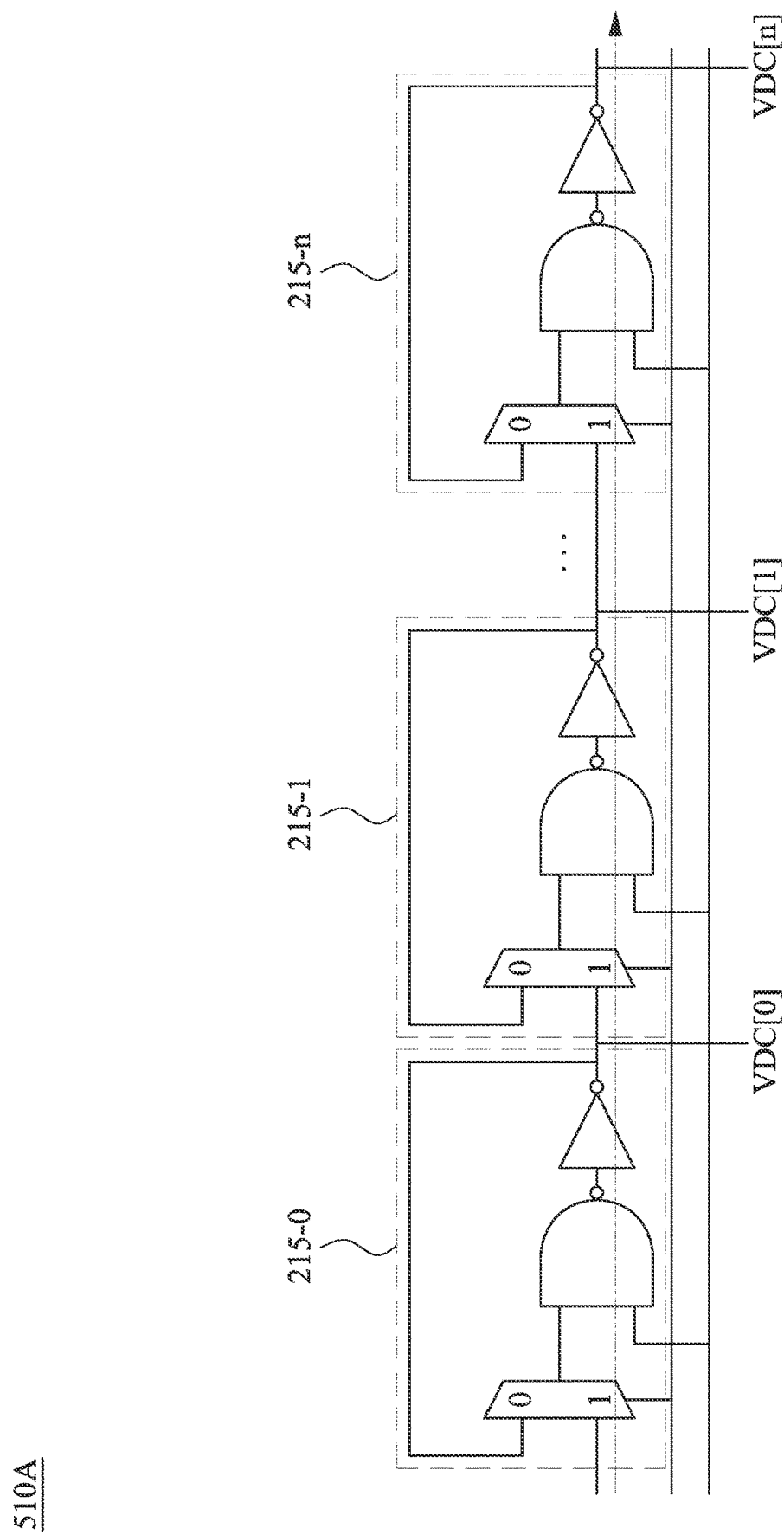
FIG. 5A depicts an operating exemplary voltage-to-digital converter included in the voltage monitor, in accordance with some embodiments of the present disclosure.

In some embodiments, the delay cells 215-0, 215-1, 215-2, . . . , and 215-n of the VDC 210 can be configured to be triggered during the period P2. FIG. 5A depicts an operating exemplary voltage-to-digital converter (VDC) 510A included in the voltage monitor, in accordance with some embodiments of the present disclosure. The VDC 510A is similar to the VDC 210 in FIG. 4A, with the difference therebetween being the lack of controller 211 (being omitted for clarity). In some embodiments, the VDC 510A shows the operations of the delay cells during the period P2.

Referring to FIG. 5A, the output signal VDC[0] of the delay cell 215-0 is in response to the enable signal. The output signal VDC[0] of the delay cell 215-0 can be transmitted to the delay cell 215-1. In response to the output signal VDC[0], the delay cell 215-1 can output the output signal VDC[1]. The output signal VDC[1] of the delay cell 215-1 can be transmitted to the next delay cell. In some embodiments, the delay cell 215-n can receive the output signal VDC[n−1] of the last delay cell. The delay cell 215-n can output the output signal VDC[n] in response to the output signal VDC[n−1]. In some embodiments, each delay cell can have the same delay time.

Referring back to FIG. 4B, the state signal can be switched to logic low at the timing T3. In some embodiments, the delay cell 215-0 can be configured to switch to a save state during a period P3 in response to the state signal. In some embodiments, the signals (data) can be saved in the delay cells at the timing T3.

Figure 5B:
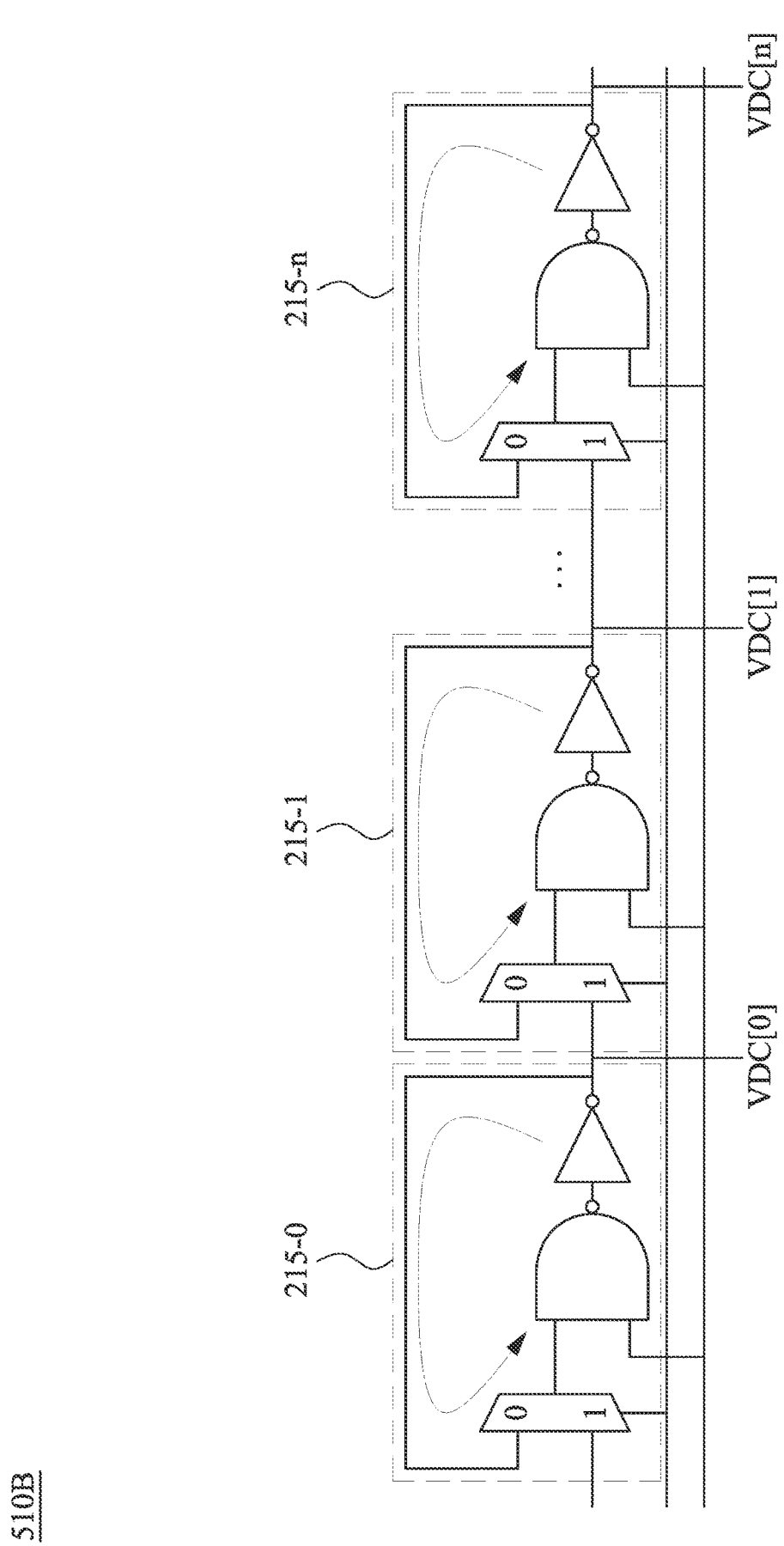
FIG. 5B depicts an operating exemplary voltage-to-digital converter included in the voltage monitor, in accordance with some embodiments of the present disclosure.

In some embodiments, the delay cells 215-0, 215-1, 215-2, . . . , and 215-n of the VDC 210 can be configured to switch to a save state during the period P3. FIG. 5B depicts an operating exemplary voltage-to-digital converter (VDC) 510B included in the voltage monitor, in accordance with some embodiments of the present disclosure. The VDC 510B is similar to the VDC 510A in FIG. 5A, with the difference therebetween being the VDC 510B showing the operations of the delay cells during the period P3.

Referring to FIG. 5B, the output signal VDC[0] is saved in the delay cell 215-0. The output signal VDC[1] is saved in the delay cell 215-1. The output signal VDC[1] is saved in the delay cell 215-1. The output signal VDC[n] is saved in the delay cell 215-n. During the period P3, the output signal of the delay cell 215-0, 215-1, 215-2, . . . , and 215-n is not transmitted to the next delay cell. In some embodiments, the output signal of the delay cell 215-0, 215-1, 215-2, . . . , and 215-n can be obtained (read) to be the digital signal (such as VDC_0 or VDC_n). The digital signal (for example, VDC_0) can be transmitted to the digital-to-binary converter (DBC) of the voltage monitor (for example, the DBC 220-0 in FIG. 2A).

Referring back to FIG. 4B, the state signal can be switched to logic high at the timing T4. In some embodiments, the delay cells of the VBC can repeat the operations shown in FIGS. 5A and 5B according to each pulse of the clock signal CLK (or state signal). Referring to FIG. 2A, the digital signal VDC_0 of the VDC 210-0 saved in the period P3 can be transmitted to the DBC 220-0, such that the digital signal VDC_0 can be converted to the binary signal DBC_0 at the timing T4.

Referring back to FIG. 4B, the state signal can be switched to logic high at the timing T5 for the next pulse. Meanwhile, the delay cells of the VBC still repeat the operations shown in FIGS. 5A and 5B according to each pulse of the clock signal CLK (or state signal). Referring to FIG. 2A, the adder 230 can be configured to combine the binary signals DBC_0, DBC_1, . . . , DBC_n at the timing T5.

In current practice, to avoid functional failure due to VDD droop, the supply voltage is increased. If the VDD droop can be detected accurately, the supply voltage is not overly increased, and thus can be reduced for power efficiency. The present disclosure provides a digital voltage monitor to make it easier to be integrated with the digital circuit. In other words, the provided voltage monitor is an all-digital circuit design optimizing integration with digital circuits. In addition, the voltage monitor 20 can achieve high resolution by adjusting the number of delay cells in the VDC according to need. The voltage monitor 20 depends on the clock signal CLK, such that the voltage detected by the voltage monitor 20 can have a high conversion speed aligned with clock speed. Due to the synchronization between the detected voltage and the clock signal, the current voltage can be monitored accurately. Moreover, the VDD detected by the voltage monitor 20 can be directly output in binary code, such that it will be easier to store and compare.

Figure 6:
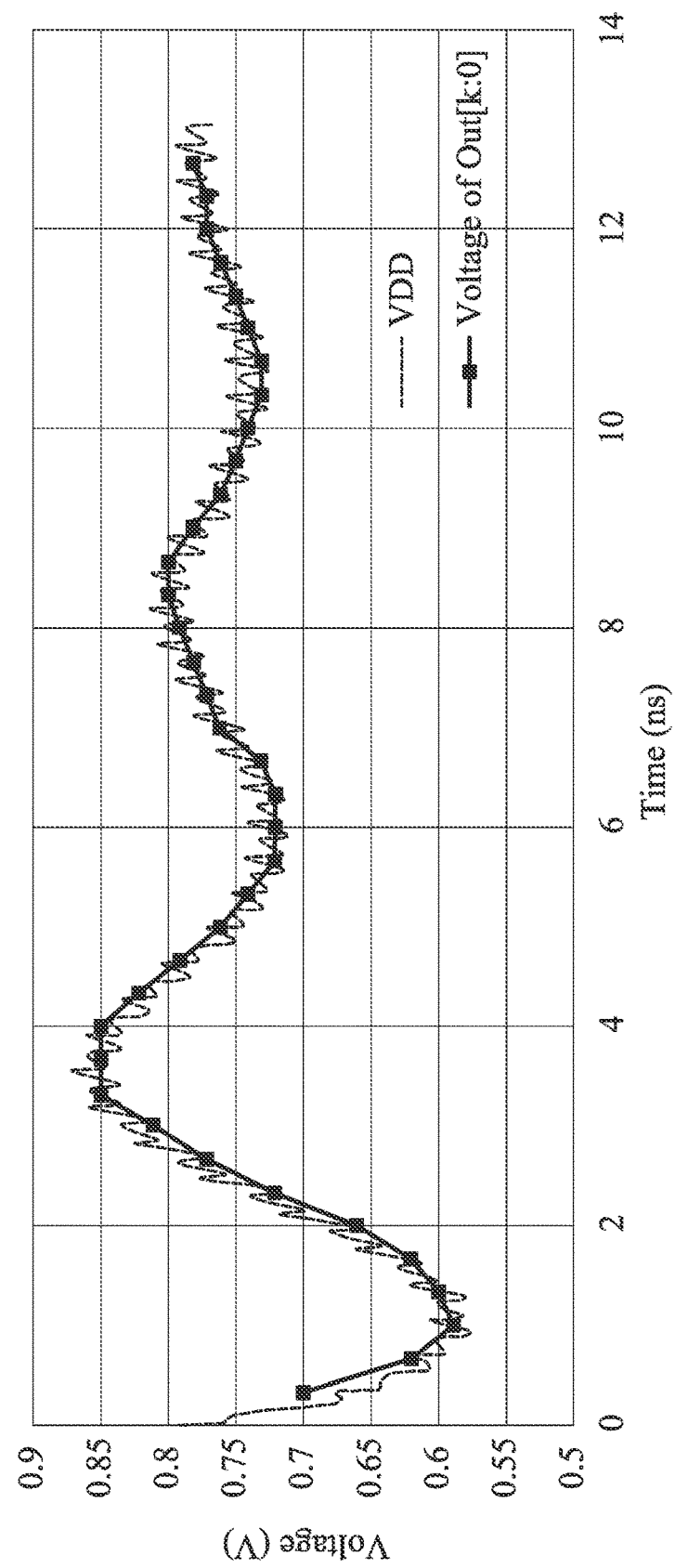
FIG. 6 is a graph illustrating time versus power voltage of a semiconductor device, in accordance with some embodiments of the present disclosure.

FIG. 6 is a graph 60 illustrating time versus power voltage of a semiconductor device, in accordance with some embodiments of the present disclosure. Referring to FIG. 6, the x-axis represents the time in nanoseconds (ns). The y-axis represents the power voltage of the semiconductor device in volts (V).

The solid line, marked voltage of Out[k:0], shows the voltage recorded by the voltage monitor (such as the voltage monitor 20 in FIG. 2A). Since the voltage monitor 20 saves the signals/data in binary code, they can be transformed back to voltage value. Therefore, the voltage values recorded by the voltage monitor 20 are shown in the graph 60. The dash line, marked VDD, may show the simulated power voltage (VDD) of the semiconductor device, which includes the voltage monitor 20.

As shown in FIG. 6, the first trough, which indicates the first VDD droop, occurs at about 1ns. The second trough, indicating the second VDD droop, occurs at about 6 ns. The third trough, indicating the third VDD droop, occurs at about 10.5 ns. Overall, the trade of the solid line substantially conforms to that of the dash line. That is, the voltage monitor 20 is accurate and thus can be applicable to monitor the VDD droop.

Figure 7:
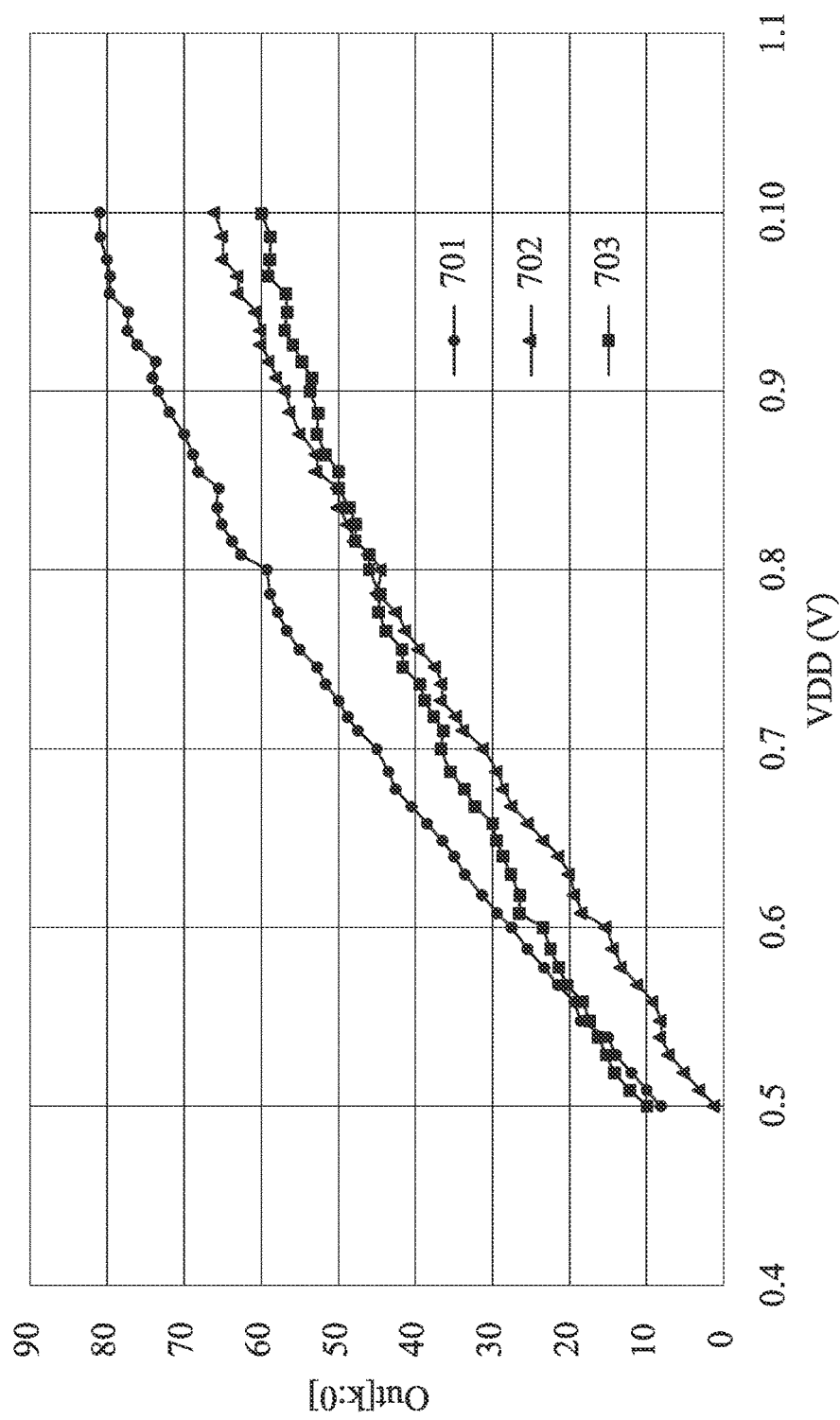
FIG. 7 is a graph illustrating power voltage (VDD) versus binary signal of the recorded voltage of a semiconductor device, in accordance with some embodiments of the present disclosure.

FIG. 7 is a graph 70 illustrating power voltage (VDD) versus binary signal of the recorded voltage of a semiconductor device, in accordance with some embodiments of the present disclosure. Referring to FIG. 7, the x-axis represents the power voltage (VDD) of the semiconductor device in voltage (V). The y-axis represents the binary signal Out[k:0] of the recorded voltage of the semiconductor device. The graph 70 includes three lines 701, 702, and 703.

The line 701 shows the binary signal Out[k:0] of the recorded voltage of the voltage monitor located in a region (corner) of the semiconductor device operating at high frequency under low temperatures. In some embodiments, the line 701 indicates the voltage monitor located in the region fast operating under a temperature of −25° C. The line 702 shows the binary signal Out[k:0] of the recorded voltage of the voltage monitor located in a region (corner) of the semiconductor device operating at low frequency under high temperatures. In some embodiments, the line 702 indicates the voltage monitor located in the region slow operating under a temperature of 125° C. The line 703 shows the binary signal Out[k:0] of the recorded voltage of the voltage monitor located in a region (corner) of the semiconductor device operating at low frequency under a low temperature. In some embodiments, the line 703 indicates the voltage monitor located in the region slow operating under a temperature of −25° C.

The lines 701, 702, and 703 can be obtained from a simulation. In some embodiments, the lines 701, 702, and 703 can be obtained by statistics. The lines 701, 702, and 703 show that different regions of the same semiconductor device can have different characteristics. For example, the lines 701, 702, and 703 show that different regions of the same semiconductor device can have different correspondence between the input power voltage and the binary output signal Out[k:0]. Therefore, one or more voltage monitors can be disposed in one semiconductor device, such that the VDD droops of the different regions of the semiconductor device, which may differ from each other, can be monitored and recorded.

FIG. 8A shows an exemplary method 80A for calibrating the voltage monitor 20 of the semiconductor device, in accordance with some embodiments of the present disclosure. The method 80A utilizes the graph 70 shown in FIG. 7 to calibrate the voltage monitors located in the semiconductor device.

The method 80A can be 1-point calibration. Referring to FIG. 8A, the method 80A includes Step 1 and Step 2. In Step 1, the VDD is set to a particular value (for example, 0.8V), and the corresponding binary signal Out[k:0] (for example, 60) can be obtained. In Step 2, the corresponding line in the graph 70 (from the lines 701, 702, and 703) is determined according to the correspondence between the input VDD and the obtained output binary signal Out[k:0]. In some embodiments, as the corresponding line in the graph 70 can be determined, the location of the voltage monitor in the semiconductor device can be determined accordingly. Once the slope of the corresponding line is determined, other binary signals Out[k:0] of the same voltage monitor can be predicted according to the slope of the corresponding line in the graph 70. In some embodiments, if the region to be calibrated is operated at high frequency under −25° C., the slope of the line 701 should obtained so as to predict the corresponding binary signal Out[k:0].

Figure 8B:
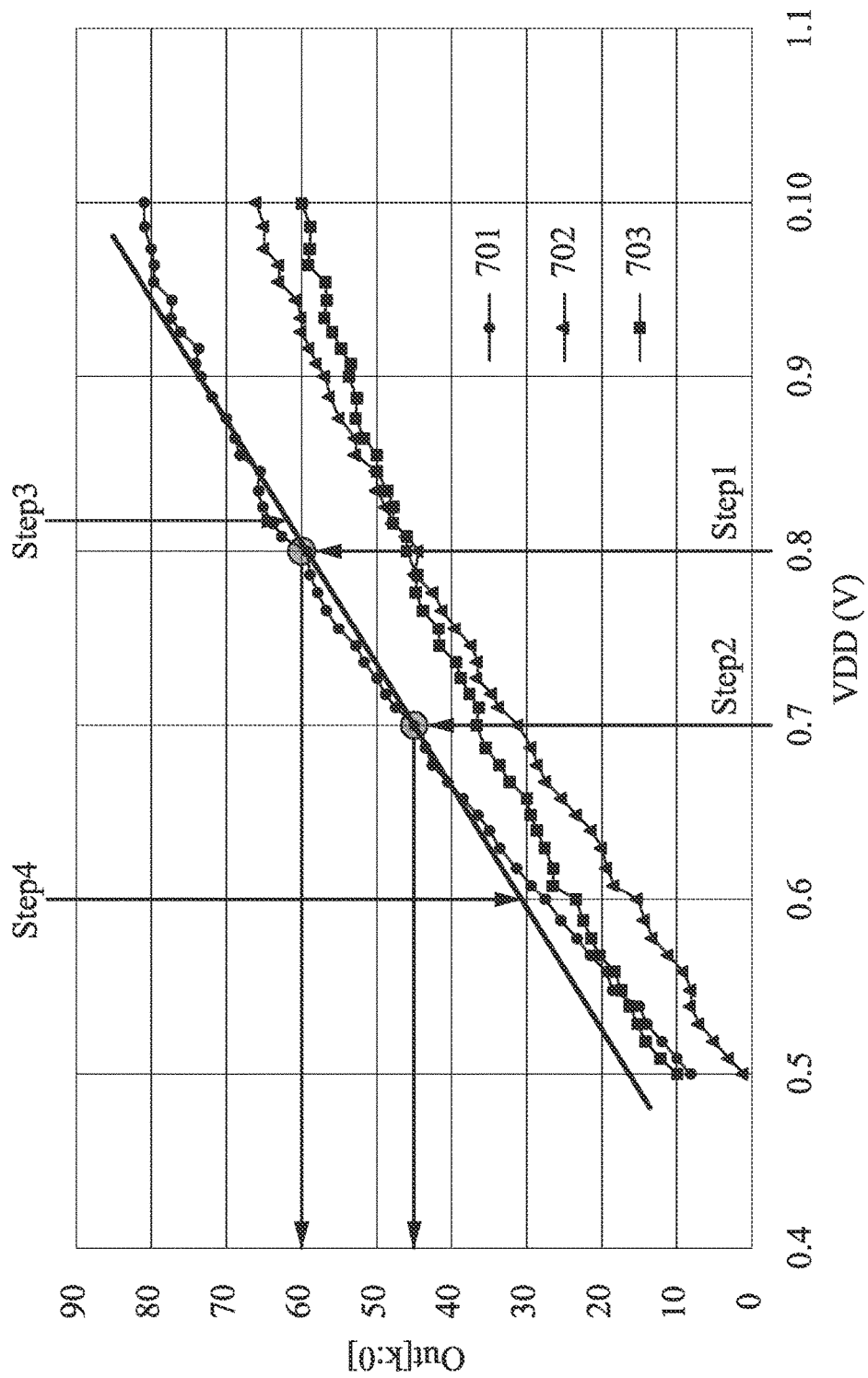
FIG. 8B shows an exemplary method for calibrating the voltage monitor of the semiconductor device, in accordance with some embodiments of the present disclosure.

FIG. 8B shows an exemplary method 80B for calibrating the voltage monitor of the semiconductor device, in accordance with some embodiments of the present disclosure. The method 80B utilizes the graph 70 shown in FIG. 7 to calibrate the voltage monitors located in the semiconductor device.

The method 80B can be 2-point calibration. Referring to FIG. 8B, the method 80B includes Steps 1, 2, 3, and 4. In Step 1, the VDD is set to a first value (for example, 0.8V), and the corresponding binary signal Out[k:0] (for example, 60) can be obtained. In Step 2, the VDD is set to a second value (for example, 0.7V), and the corresponding binary signal Out[k:0] (for example, 45) can be obtained. In Step 3, the slope of the corresponding line (the inclined line approaching the line 701) is calculated according to the two points in Steps 1 and 2. In some embodiments, as the corresponding line can be determined, the location of the voltage monitor in the semiconductor device can be determined accordingly based on the graph 70. In Step 4, other binary signals Out[k:0] can be calculated based on the calculated slope of the corresponding line, in response to the VDD. Since the slope of the corresponding line is determined, other binary signals Out[k:0] of the same voltage monitor can be predicted according to the slope of the corresponding line.

Figure 8C:
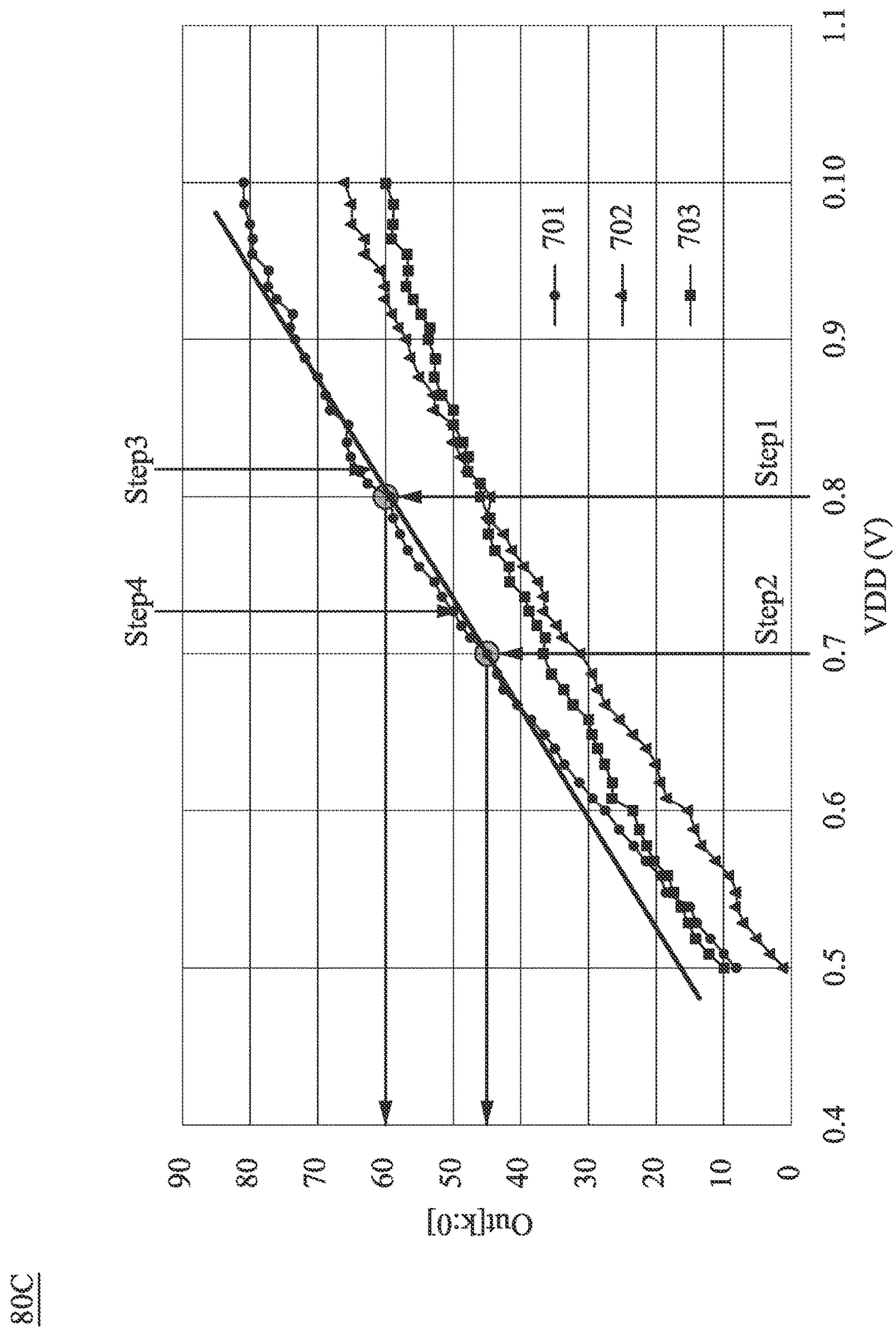
FIG. 8C shows an exemplary method for calibrating the voltage monitor of the semiconductor device, in accordance with some embodiments of the present disclosure.

FIG. 8C shows an exemplary method 80C for calibrating the voltage monitor of the semiconductor device, in accordance with some embodiments of the present disclosure.

The method 80C can be multi-point calibration. Referring to FIG. 8C, the method 80C includes Steps 1, 2, 3, and 4, and then repeats Steps 1 through 4 for other voltage ranges. In Step 1, the VDD is set to a first value (for example, 0.8V), and the corresponding binary signal Out[k:0] (for example, 60) can be obtained. In Step 2, the VDD is set to a second value (for example, 0.7V), and the corresponding binary signal Out[k:0] (for example, 45) can be obtained. In Step 3, the slope of corresponding line (the inclined line approaching the line 701) is calculated according to the two points in Steps 1 and 2. In some embodiments, as the corresponding line can be determined, the location of the voltage monitor in the semiconductor device can be determined accordingly based on the graph 70. In Step 4, other binary signals Out[k:0], in response to the VDD only in the range of 0.7 to 0.8V, can be calculated based on the slope of the corresponding line.

For the VDD out of the particular range (0.7 to 0.8V), the aforementioned Steps 1 to 4 should repeat to obtain a line corresponding to desired range. For example, if the binary signal Out[k:0] corresponding to the VDD of 0.65V is to be calculated, the Steps 1 to 4 are performed under the VDD in the range of 0.6 to 0.7V.

After utilizing the methods shown in FIGS. 8A-8C calibrating the region to be tested of the semiconductor device, the VDD droop can be detected and recorded by the voltage monitor. In one embodiment, it can be determined whether the monitored voltage droop exceeds a threshold so as to avoid function failure. If the VDD droop is determined to have exceeded a threshold, such as 10% VDD, the chips adjacent to the voltage monitor can be controlled to reduce activities and clock speed. In some embodiments, if the VDD droop is determined to exceed a threshold, such as 10% VDD, the voltage regulator, which provides the power voltage (VDD) to the semiconductor device, can be controlled to increase the VDD.

In another embodiment, the monitored voltage can be utilized to predict the VDD droop so as to avoid function failure. If the monitored VDD slope is greater than a threshold, the chips adjacent to the voltage monitor can be controlled to reduce activities and clock speed in advance. If the monitored VDD slope (which may be calculated based on two recorded values) is greater than a threshold, the voltage regulator, which provides the power voltage (VDD) to the semiconductor device, can be controlled to increase the VDD in advance.

Figure 9:
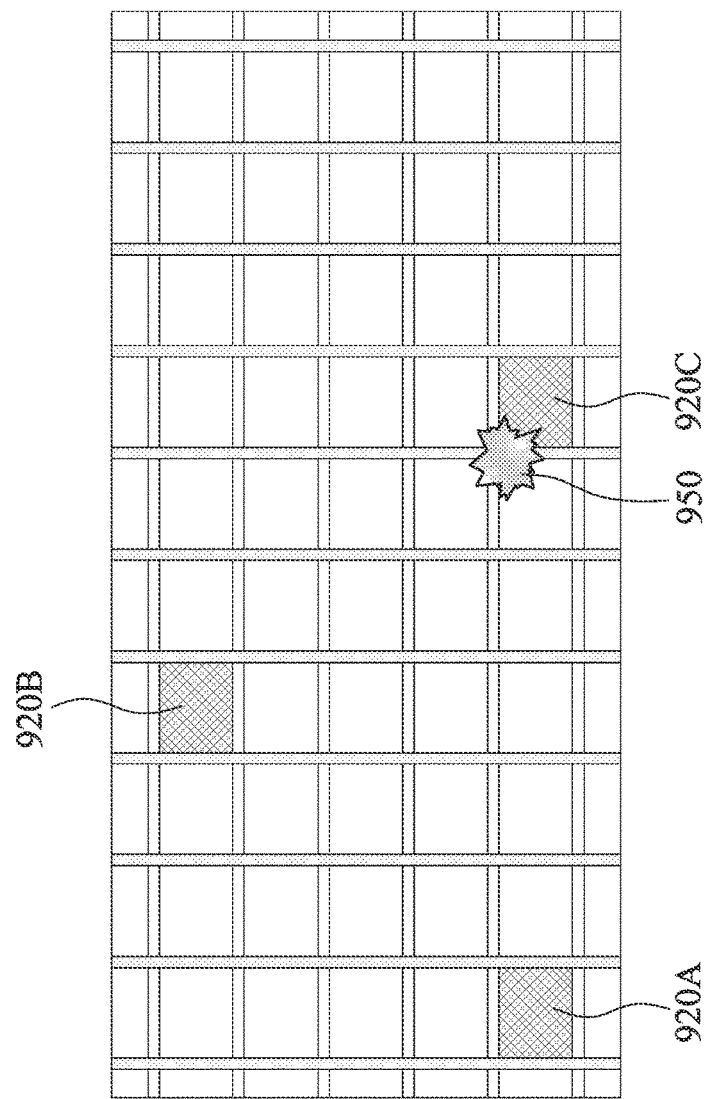
FIG. 9 is a top view of an exemplary semiconductor device, in accordance with some embodiments of the present disclosure.

FIG. 9 is a top view of an exemplary semiconductor device 90, in accordance with some embodiments of the present disclosure. The semiconductor device 90 can include chips (or semiconductor dies), voltage monitors 920A, 920B, and 920C, and power delivery network. In some embodiments, the semiconductor device 90 can include a substrate (not shown). The chips and the voltage monitors 920A, 920B, and 920C can be disposed on the substrate. One or more voltage monitors 920A, 920B, and 920C can be disposed within the chips. In some embodiments, the voltage monitors 920A, 920B, and 920C can be located in the regions of the semiconductor device 90, which may operate in different frequency. The power delivery network can connect the chips to deliver power. In some embodiments, the power delivery network can connect the chips and the voltage monitors to provide power supply voltage to them.

In some embodiments, the voltage monitors 920A, 920B, and 920C can determine the power supply voltage of the chips adjacent thereto. As shown in FIG. 9, the hot spot 950 may occur about the voltage monitor 920C. In some embodiments, the hot spot 950 may be caused by the large VDD droop. Since the chips may functionally fail due to large VDD droop, the hot spot 950 may therefore occur. As the voltage monitor 920C is disposed near the hot spot 950, the function failure can be avoid by monitoring the VDD droop.

In one embodiment, the present disclosure provides a voltage monitor. The voltage monitor includes a first voltage-to-digital converter (VDC), a second VDC, a first digital-to-binary converter (DBC), a second DBC, and an adder. The first VDC is configured to generate a first digital signal in response to a clock signal, and the second VDC is configured to generate a second digital signal in response to the clock signal. The first DBC is connected to the first VDC, and configured to convert the first digital signal to a first binary signal. The second DBC is connected to the second VDC, and configured to convert the second digital signal to a second binary signal. The adder is connected to the first DBC and the second DBC, and configured to combine the first binary signal and the second binary signal into an output signal.

In another embodiment, the present disclosure provides a voltage monitor. The voltage monitor includes a plurality of voltage-to-digital converters (VDC), a plurality of digital-to-binary converters (DBC), and an adder connected to the plurality of DBCs. Each of the plurality of VDCs is configured to generate a respective digital signal in response to a clock signal. Each of the plurality of DBCs is connected to a corresponding VDC of the plurality of VDCs, and configured to convert each of the respective digital signals to a respective binary signal. The adder is configured to combine the respective binary signals of the plurality of the DBCs into an output signal.

In some embodiments, the present disclosure provides a semiconductor device. The semiconductor includes a substrate, a plurality of semiconductor dies disposed on the substrate, and a voltage monitor disposed on the substrate, such that the voltage monitor determines a power supply voltage of the semiconductor dies adjacent to the voltage monitor.

The methods and features of the present disclosure have been sufficiently described in the above examples and descriptions. It should be understood that any modifications or changes without departing from the spirit of the present disclosure are intended to be covered in the protection scope of the present disclosure.

Moreover, the scope of the present application in not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, can be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A voltage monitor, comprising:
    a first voltage-to-digital converter (VDC) configured to generate a first digital signal in response to a clock signal;
    a second VDC configured to generate a second digital signal in response to the clock signal;
    a first digital-to-binary converter (DBC) connected to the first VDC, and configured to convert the first digital signal to a first binary signal;
    a second DBC connected to the second VDC, and configured to convert the second digital signal to a second binary signal; and
    an adder connected to the first DBC and the second DBC, and configured to combine the first binary signal and the second binary signal into an output signal.

2. The voltage monitor of claim 1, further comprising:
    an overshoot detector connected to the adder, and configured to detect and store a maximum value of the output signal.

3. The voltage monitor of claim 2, further comprising:
    an undershoot detector connected to the adder, and configured to detect and store a minimum value of the output signal.

4. The voltage monitor of claim 3, further comprising:
    a multiplexer (MUX) connected to the adder, the overshoot detector, and the undershoot detector, wherein the MUX is configured to output one of:
    a current value of the output signal from the adder,
    the maximum value of the output signal from the overshoot detector, or
    the minimum value of the output signal from the undershoot detector.

5. The voltage monitor of claim 1, wherein the first VDC comprises:
    a controller configured to receive the clock signal, and generate an enable signal, a state signal, and a reset signal;
    a first delay cell connected to the controller, wherein the first delay cell has a reset terminal configured to receive a reset signal, a first terminal configured to receive the enable signal, a second terminal configured to receive the state signal, and an output terminal configured to output a first output signal; and
    a second delay cell connected to the controller, the second delay cell has a reset terminal configured to receive a reset signal from the controller, a first terminal configured to receive the first output signal from the first delay cell, a second terminal configured to receive the state signal from the controller, and an output terminal configured to output a second output signal.

6. The voltage monitor of claim 5, wherein the first delay cell is configured to:
    be reset during a first period in response to the reset signal;
    be triggered during a second period in response to the enable signal; and
    switch to a save state during a third period in response to the clock signal.

7. The voltage monitor of claim 5, wherein the first digital signal generated by the first VDC is based on the first output signal generated by the first delay cell and the second output signal generated by the second delay cell.

8. The voltage monitor of claim 5, wherein the first delay cell comprises:
    a two-to-one multiplexer (MUX) including a first input terminal configured to receive the enable signal, a second input terminal, a selector terminal configured to receive the state signal, and an output terminal;
    a logic gate including a first input terminal connected to the output terminal of the MUX, a second input terminal configured to receive the reset signal, and an output terminal; and
    an inverter including an input terminal connected to the output terminal of the logic gate and an output terminal connected to the second input terminal of the MUX.

9. The voltage monitor of claim 1, wherein the first VDC includes a plurality of delay cells, wherein the second VDC includes a plurality of delay cells, and wherein the delay cells of the first VDC has a delay time different from that of the delay cells of the second VDC.

10. A semiconductor device comprising:
    a substrate;
    a plurality of semiconductor dies disposed on the substrate; and
    the voltage monitor according to claim 1 disposed on the substrate, such that the voltage monitor determines a power supply voltage of the semiconductor dies adjacent to the voltage monitor.

11. A voltage monitor, comprising:
    a plurality of voltage-to-digital converters (VDC), each configured to generate a respective digital signal in response to a clock signal;
    a plurality of digital-to-binary converters (DBC), each connected to a corresponding VDC of the plurality of VDCs, and configured to convert each of the respective digital signals to a respective binary signal;
    an adder connected to the plurality of DBCs, and configured to combine the respective binary signals of the plurality of the DBCs into an output signal.

12. The voltage monitor of claim 11, further comprising:
    an overshoot detector connected to the adder and configured to:
    (i) receive the output signal;
    (ii) compare the output signal and a first initial signal stored in the overshoot detector; and
    (iii) store the output signal in the overshoot detector when the output signal exceeds the first initial signal.

13. The voltage monitor of claim 12, wherein the overshoot detector is further configured to repeat the operations (i) to (iii) such that the overshoot detector store a maximum value of the output signal.

14. The voltage monitor of claim 13, further comprising:
    an undershoot detector connected to the adder, the undershoot detector configured to
    (a) receive the output signal;
    (b) compare the output signal and a second initial signal stored in the undershoot detector; and
    (c) store the output signal in the undershoot detector when the output signal is less than the second initial signal.

15. The voltage monitor of claim 14, wherein the undershoot detector is further configured to repeat the operations (a) to (c) such that the undershoot detector store a minimum value of the output signal.

16. The voltage monitor of claim 15, further comprising:
a multiplexer (MUX) connected to the adder, the overshoot detector, and the undershoot detector, wherein the MUX is configured to output one of:
a current value of the output signal from the adder,
the maximum value of the output signal from the overshoot detector, or
the minimum value of the output signal from the undershoot detector.

17. The voltage monitor of claim 11, wherein each of the plurality of VDCs comprises:
a controller configured to receive the clock signal, and generate an enable signal, a state signal, and a reset signal;
a first delay cell connected to the controller and configured to receive the enable signal, the state signal, and the reset signal, wherein the first delay cell is configured to generate a first output signal in response to the enable signal, the state signal, and the reset signal; and
a second delay cell connected to the controller and the first delay cell, the second delay cell configured to receive the state signal and the reset signal from the controller and to receive the first output signal from the first delay cell, wherein the second delay cell is configured to generate a second output signal in response to the first output signal, the state signal, and the reset signal.

18. The voltage monitor of claim 17, wherein the first delay cell is configured to:
be reset during a first period in response to the reset signal;
be triggered during a second period in response to the enable signal; and
switch to a save state during a third period in response to the clock signal.

19. The voltage monitor of claim 17, wherein the respective digital signal generated by each of the plurality of VDCs is based on the first output signal generated by the first delay cell and the second output signal generated by the second delay cell.

20. The voltage monitor of claim 17, wherein the first delay cell comprises:
a two-to-one multiplexer (MUX) including a first input terminal configured to receive the enable signal, a second input terminal, a selector terminal configured to receive the state signal, and an output terminal;
a logic gate including a first input terminal connected to the output terminal of the MUX, a second input terminal configured to receive the reset signal, and an output terminal; and
an inverter including an input terminal connected to the output terminal of the logic gate and an output terminal connected to the second input terminal of the MUX.

* * * * *